(12) United States Patent
Kwon

(10) Patent No.: US 6,489,182 B2
(45) Date of Patent: Dec. 3, 2002

(54) METHOD OF FABRICATING A WIRE ARRAYED CHIP SIZE PACKAGE

(75) Inventor: Yong-Tae Kwon, Cheongju (KR)

(73) Assignee: Hynix Semiconductur, Inc., Kyoungki-do (KR)

( * ) Notice: Subject to any disclaimer, the term of this patent is extended or adjusted under 35 U.S.C. 154(b) by 0 days.

(21) Appl. No.: 09/989,494

(22) Filed: Nov. 21, 2001

(65) Prior Publication Data

US 2002/0030289 A1 Mar. 14, 2002

Related U.S. Application Data

(62) Division of application No. 09/394,508, filed on Sep. 13, 1999, now Pat. No. 6,339,260.

(30) Foreign Application Priority Data

Mar. 9, 1999 (KR) .............................. 99/7746

(51) Int. Cl.⁷ .............................................. H01L 21/48
(52) U.S. Cl. .................. 438/110; 438/126; 438/127; 438/612; 438/617; 29/830; 29/841; 29/842; 29/855; 29/856
(58) Field of Search .............................. 438/126, 127, 438/612, 617, 128, 129, 110, 118, 618, 125; 29/841, 855, 856, 825, 830, 842, 843; 257/776, 780, 783, 784, 787

(56) References Cited

U.S. PATENT DOCUMENTS

| | | | |
|---|---|---|---|
| 5,467,253 A | 11/1995 | Heckman et al. | 361/761 |
| 5,554,887 A | 9/1996 | Sawai et al. | 257/737 |
| 5,604,379 A | 2/1997 | Mori | 257/738 |
| 5,729,053 A | 3/1998 | Orthmann | 257/724 |
| 5,889,333 A | 3/1999 | Takenaka et al. | 257/783 |
| 5,977,624 A | 11/1999 | Heo et al. | 257/701 |
| 6,028,354 A | 2/2000 | Hoffman | 257/706 |
| 6,072,238 A | 6/2000 | Viswanathan et al. | 257/719 |
| 6,133,072 A | 10/2000 | Fjelstad | 438/128 |
| 6,194,778 B1 | 2/2001 | Ohsawa et al. | 257/668 |
| 6,228,548 B1 | 5/2001 | King et al. | 438/106 |
| 6,339,260 B1 * | 1/2002 | Kwon | 257/784 |

FOREIGN PATENT DOCUMENTS

| | | |
|---|---|---|
| JP | 9-64080 | 3/1997 |
| JP | 10-284638 | 10/1998 |
| JP | 11-16959 | 1/1999 |
| JP | 11-354577 | 12/1999 |
| JP | 12-236044 | 8/2000 |
| JP | 12-307032 | 11/2000 |

* cited by examiner

*Primary Examiner*—Kamand Cuneo
*Assistant Examiner*—Alonzo Chambliss
(74) *Attorney, Agent, or Firm*—Birch, Stewart, Kolasch & Birch, LLP

(57) ABSTRACT

A chip size package is fabricated by: etching portions of a copper film on an insulating film tape, forming a solder mask on the insulating film tape excluding inner holes of metal pattern units and four edge portions of the copper film, electroplating, attaching the semiconductor chip, sealing the semiconductor chip with an epoxy, etching to expose the chip pads, electrically connecting the chip pads by wires, eliminating portions of the copper film remaining at the four edge portions and cutting the insulating film tape into individual units.

10 Claims, 12 Drawing Sheets

METHOD OF FABRICATING A WIRE ARRAYED CHIP SIZE PACKAGE

This application is a divisional of application Ser. No. 09/394,508, filed on Sep. 13, 1999, now U.S. Pat. No. 6,339,260 the entire contents of which are hereby incorporated by reference and for which priority is claimed under 35 U.S.C. §120; and this application claims priority of Application Ser. No. 7746/1999 filed in Korea on Mar. 9, 1999 under 35 U.S.C. §119.

BACKGROUND OF THE INVENTION

1. Field of the Invention

The present invention relates to a package for a semiconductor device, and more particularly to a wire arrayed chip size package and a fabrication method thereof, which are small and thinly packaged so that the package has a similar size with a semiconductor chip.

2. Description of Conventional Art

A general structure of a conventional chip size package consists of metal pattern units ribbon-bonded to chip pads of a semiconductor chip, solder balls attached on the metal pattern unit and a molding resin sealing peripheral portions of the chip pads, wherein electrical signals of the chip pads are externally transmitted through the solder balls.

FIG. 1 illustrates the cross-section of a structure of the above-mentioned conventional chip size package. Referring to FIG. 1, a method of fabricating the conventional chip size package will also be discussed.

First, holes 13 are formed to perform a ribbon bonding 19 in an insulating film tape 12 on which a copper film is formed, metal pattern units 14 are formed by etching the copper film and a solder mask 16 is formed on an exposed upper surface of the insulating film tape 12 and the metal pattern units 14 except portions on which solder balls 22 will be attached.

Next, nickel and gold plating are sequentially applied on the surfaces of the metal pattern units 14 which are exposed on the holes 13 in order to perform the ribbon bonding 19 to chip pads 18. A semiconductor chip 10 is attached to a bottom surface of the insulating film tape 12. Then the ribbon bonding 19 is performed at a portion formed between the chip pads 18 and the corresponding metal pattern units 14 through the holes 13. A molding process is then performed by which an epoxy mold compound (EMC) 20 is injected into each of the holes 13.

Further, flux is applied on the portions of the metal pattern units 14, on which solder balls 22 will be attached, the solder balls 22 are mounted on the flux and then the solder balls 22 are fixed by reflowing. The fabrication method of the conventional chip size package is completed by singularizing the resultant package.

However, in the thusly fabricated conventional chip size package, since the solder balls 22 are used as external terminals which externally transmit electrical signals, it is required to have the metal pattern units 14 which transmit the electrical signals from the chip pads 18 to the solder balls 22 and also it is required to form a separate region for performing the ribbon bonding 19 of the metal pattern units 14 and the chip pads 18. In addition, in consideration of a size of each solder ball itself and a predetermined distance between the solder balls 22, there is a problem in which the number of pins provided in a package must be limited. Further, since the electric signal transmission is achieved from the chip pads 18 through various mediums such as the ribbon bonding 19, the metal pattern units 14 and the solder balls 22, it is difficult to improve the electric characteristics of the package. Lastly, since a back side of the semiconductor chip is externally exposed, it is difficult to protect the chip from external surroundings.

SUMMARY OF THE INVENTION

Accordingly, the present invention is directed to a wire arrayed chip size package and a fabrication method thereof which obviate the problems and disadvantages associated with the conventional art.

An object of the present invention is to provide a wire arrayed chip size package in which wires which are considerably finer than conventional solder balls are used as external terminals and wires are directly bonded between chip pads and metal pattern units, which results in achieving a size thereof similar to a semiconductor chip and high integration of pins in the same chip size.

To achieve these and other advantages and in accordance with the purpose of the present invention, as embodied and broadly described, there is provided a wire arrayed chip size package which includes: a semiconductor chip having a plurality of chip pads; an insulating film tape having a plurality of holes of which a bottom surface is attached with the semiconductor chip; metal pattern units formed on the insulating film tape; a solder mask covering the insulating film tape and portions of the metal pattern units; metal pattern unit-electroplates formed on portions of the metal pattern units which are not covered with the solder mask; wires electrically connecting the chip pads and the metal pattern unit-electroplates; and a molding resin for sealing side surfaces and a bottom surface of the semiconductor chip, excluding an upper surface thereof.

Also, to achieve the above object of the present invention, there is provided a method for fabricating a chip size package which includes: etching a copper film applied on an insulating film tape, except for longitudinal marginal portions of the copper film, metal pattern units thereof which are peripheral to portions corresponding to chip pads of a semiconductor chip and portions thereof connecting the longitudinal marginal portions and the metal pattern units; forming a solder mask on the insulating film tape excluding inner holes of the metal pattern units, the copper film excluding four edge portions of the longitudinal marginal portions thereof and exterior circular marginal portions of the metal pattern units; electroplating portions of surfaces of the metal pattern units on which the solder mask is not formed, for thereby forming metal pattern unit-electroplates; attaching the semiconductor chip to a bottom surface of the insulating film tape; molding side surfaces and a bottom surface of the semiconductor chip with an epoxy mold compound; etching portions of the insulating film tape formed on the chip pads for thereby exposing the chip pads; electrically connecting by wires the metal pattern unit-electrodes and the corresponding chip pads; and eliminating portions of the copper film remaining at the four edge portions of the longitudinal marginal portions thereof and cutting the resultant insulating film tape to be separated into individual units.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

FIGS. 2A through 14B sequentially illustrate a method of fabricating a wire arrayed chip size package according to a first embodiment of the present invention, wherein;

FIG. 2A is a plane diagram illustrating a piece of wafer in which a plurality of semiconductor chips are fabricated;

FIG. 8 is a cross-sectional view of an insulating film tape illustrating an EMC molding process;

FIG. 9 is a cross-sectional view magnifying one of exposed chip pads;

FIG. 12 is a cross-sectional view magnifying one of chip pads illustrating a wire-electroplating process;

FIG. 13 is a plane diagram of an insulating film tape showing cutting lines;

FIG. 14B is a cross-sectional view of a completely fabricated chip size package;

FIGS. 15A and 15B are a plane diagram and a cross-sectional diagram, respectively, illustrating a part of a fabrication method of a wire arrayed chip size package according to a second embodiment of the present invention, wherein;

FIG. 15A is a plane diagram magnifying one of chip pads for illustrating a wire bonding which is different from the one in the first embodiment according to the present invention;

FIG. 15B is a cross-sectional view taken along the line XVb—XVb in FIG. 15A.

DETAILED DESCRIPTION OF THE INVENTION

Reference will now be made in detail to the preferred embodiments of the present invention, examples of which are illustrated in the accompanying drawings.

Referring to FIGS. 2A through 14B, a method of fabricating a chip size package according to a first embodiment of the present invention will now be illustrated in detail.

Figure 1:
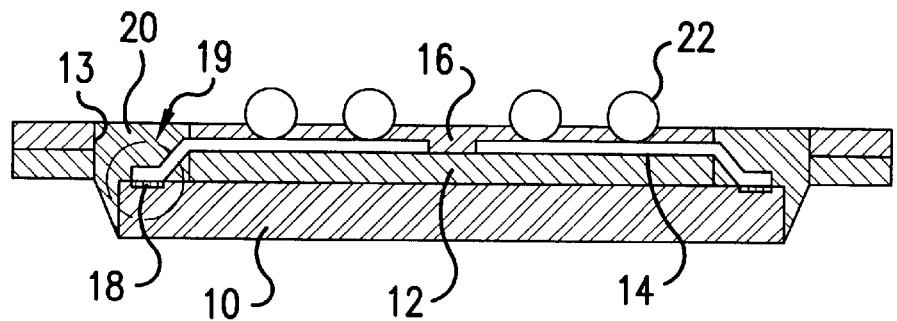
FIG. 1 is a cross-sectional view of a general structure of a conventional chip size package.
Figure 2A:
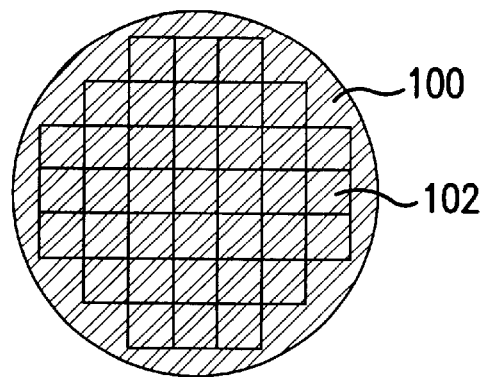
Figure 2B:
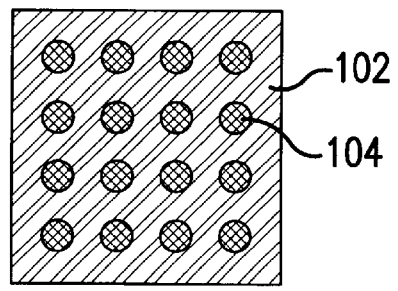
FIG. 2B is a plane diagram magnifying a single semiconductor chip in a wafer of the FIG. 2A.

FIG. 2A is a plane diagram which shows a wafer 100 in which a plurality of semiconductor chips 102 are fabricated. FIG. 2B is a plane diagram in which one of the semiconductor chips 102 in FIG. 2A is magnified.

First, the wafer 100 shown in FIG. 2A is cut, for separating portions of the wafer into individual units, one of which defining the semiconductor chip 102. As shown in FIG. 2B, chip pads 104 are arranged in a matrix.

Figure 3A:
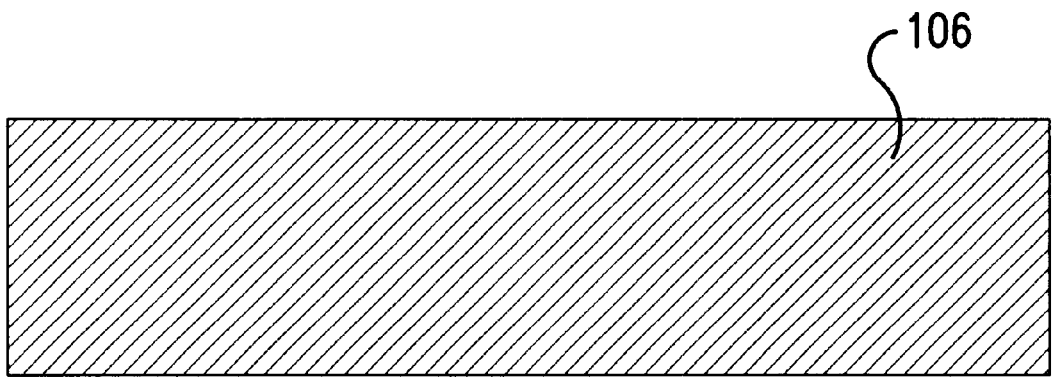
FIG. 3A is a plane diagram of an insulating film tape on which a copper film is applied.
Figure 3B:
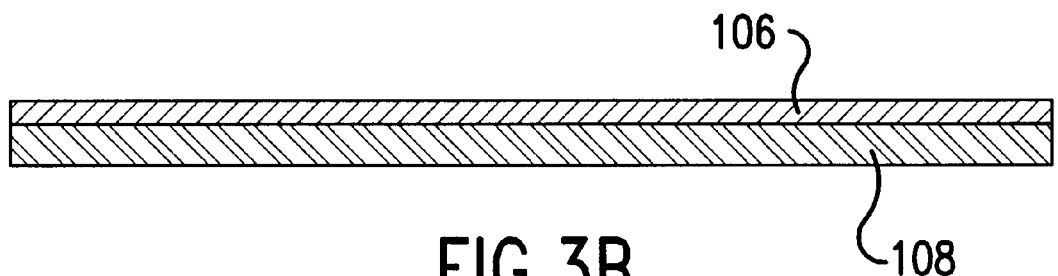
FIG. 3B is a cross-sectional diagram of FIG. 3A.

FIGS. 3A and 3B are a plane diagram and a cross-sectional view, respectively, of an insulating film tape 108 on which a copper film 106 is applied. Here, the fabrication method of the wire arrayed chip size package according to the present invention includes a photolithography process of the insulating film tape which is different from the chip size package fabrication method in the conventional art. Thus, it is noted that the insulating film tape 108 is formed of a material which can be etched using photolithography.

Figure 4A:
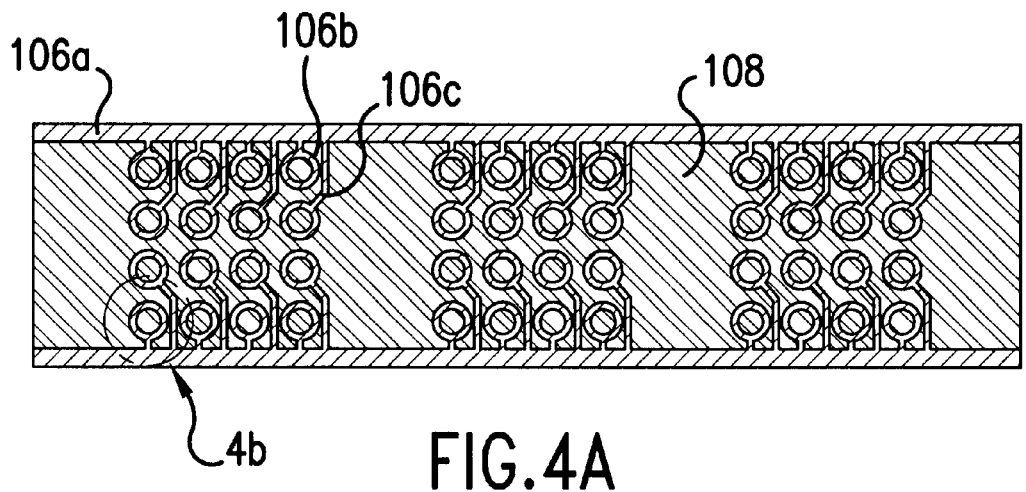
FIG. 4A is a plane diagram of an insulating film tape on which a copper film is partially etched.

Next, FIG. 4A is a plane diagram of the insulating film tape 108 on which the copper film 106 is partially etched. The insulating film tape 108 is exposed by etching the copper film 106, excluding longitudinal marginal portions of the copper film 106, portions thereof which are formed to be peripheral to the chip pads 104 and portions thereof connecting the longitudinal marginal portions and the portions which are peripheral to the chip pads 104. The remaining portions of the copper film 106 are copper film portions 106a at the longitudinal marginal portions of the copper film 106, copper film portions 106b remaining at peripheral portions of the chip pads 104 and copper film portions 106c remaining at the portions connecting the above two copper film portions 106a and 106b. In FIG. 4A, the insulating film tape 108 has a predetermining length for which three semiconductor chips can be attached. However this length has been determined for the convenience of the illustration. Thus, the length of the insulating film tape 108 can be arbitrarily adjusted to a desired length for attaching, for example, 8, 16 or 32 semiconductor chips.

Figure 4B:
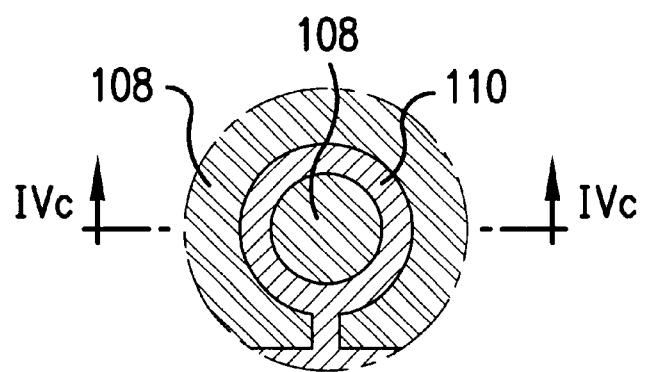
FIG. 4B is a plane diagram magnifying one of metal pattern units in FIG. 4A.

FIG. 4B is a plane diagram magnifying one of the copper film portions 106b which remain at the peripheral portions of the chip pads 104 in FIG. 4A. As shown therein, the copper film portions 106b remaining at the peripheral potions of the chip pads 104 will be referred as metal pattern units 110, since these portions serve as metals for transferring electric signals from the chip pads.

Figure 4C:
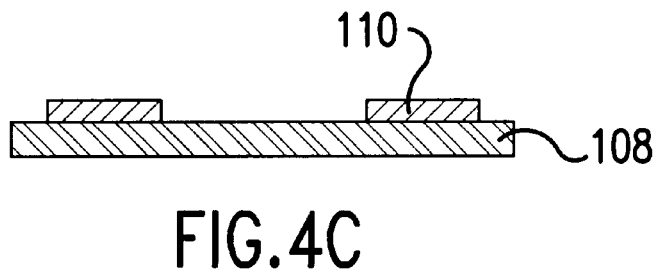
FIG. 4C is a cross-sectional view taken along the line IVc—IVc of FIG. 4B.

In FIG. 4C which is a cross-sectional view taken along the line IVc—IVc in FIG. 4B, the metal pattern units 110 remain on the insulating film tape 108.

Figure 5A:
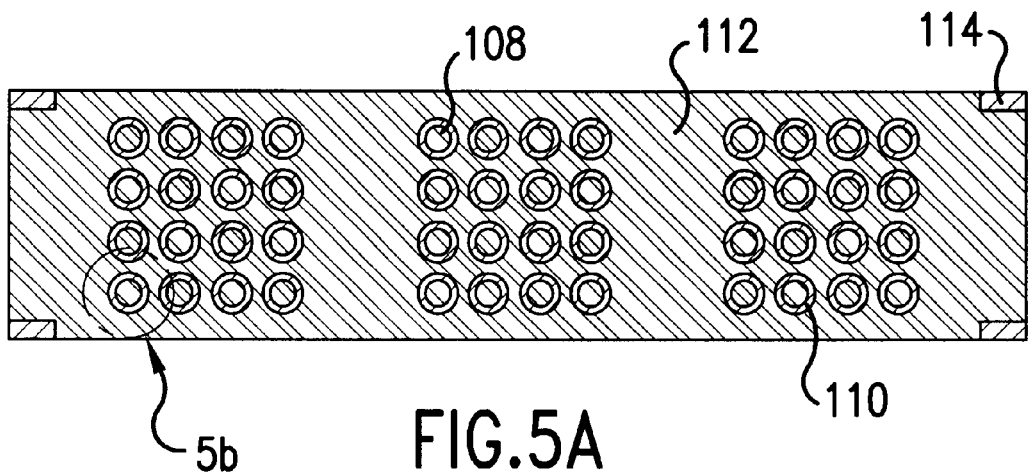
FIG. 5A is a plane diagram of an insulating film tape on which a solder mask is partially formed.
Figure 5B:
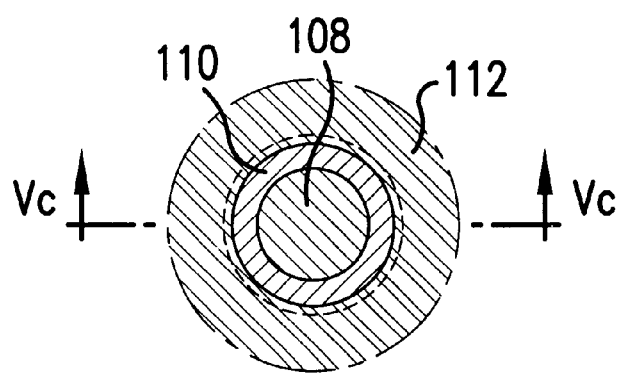
FIG. 5B is a plane diagram magnifying one of metal pattern units in FIG. 5A.
Figure 5C:
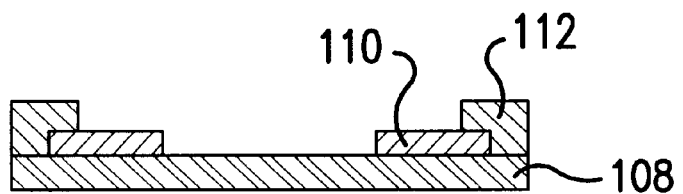
FIG. 5C is a cross-sectional view taken along the line Vc—Vc of FIG. 5B.

Further, FIG. 5A is a plane diagram of the insulating film tape 108 on which a solder mask 112 is partially formed; FIG. 5B is a plane diagram wherein one of the metal pattern units 110 of FIG. 5A is magnified; and FIG. 5C is a cross-sectional view taken along the line Vc—Vc of FIG. 5B.

More specifically, the solder mask 112 is formed on an upper surface portion of the insulating film tape 108 excluding inner holes of the metal pattern units 110 and an upper portion of the copper film portion, except for four edge portions of the copper film portions 106a which remain at the longitudinal margins. Here, it is noted that the solder mask 112, as shown in FIG. 5C, is formed, being extended over the metal pattern unit 110, that is to an exterior circular marginal portion of the metal pattern unit 110. Here, a dotted line ( - - - ) in FIG. 5B indicates a boundary of the metal pattern unit 110 formed below the solder mask 112. In addition, copper film portions which remain at the four edge portions of the longitudinal copper film portions 106a respectively serve as plating electrodes in a later described electroplating process. These portions will be referred to as plating electrodes 114. The plating electrodes 114 are part of the copper film 106 which is substantially under the solder mask 112. Since the copper film portions 106a which are formed on the longitudinal marginal portions of the insulating film tape 108 to which the plating electrodes 114 belong are connected with the copper film portions 106b of the metal pattern units 110 by the copper film portions 106c formed therebetween, if the plating electrodes 114 are formed at the four edge portions of the insulating film tape 108, the length of the insulating film tape 108 does not have to be considered.

Figure 6A:
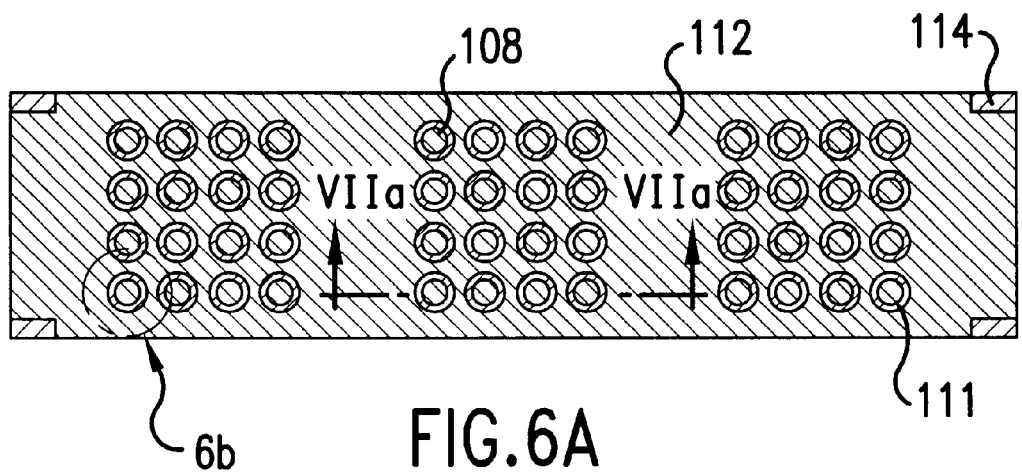
FIG. 6A is a plane diagram of an insulating film tape illustrating a metal pattern unit-electroplating process.
Figure 6B:
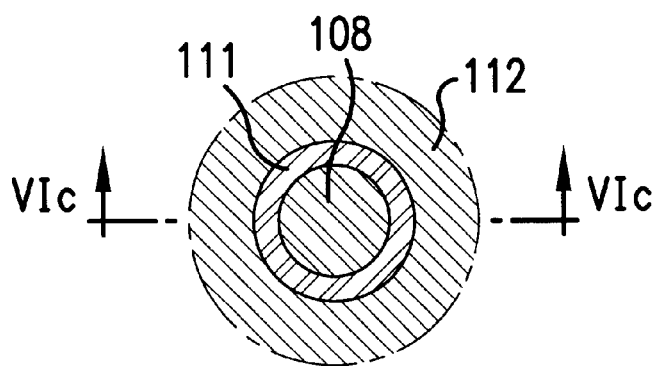
FIG. 6B is a plane diagram magnifying one of metal pattern units in FIG. 6A.
Figure 6C:
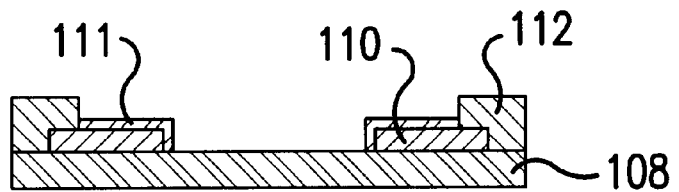
FIG. 6C is a cross-sectional view taken along the line VIc—VIc of FIG. 6B.

FIG. 6A is a plane diagram of the insulating film tape 108 which illustrates an electroplating process applied to the metal pattern units 110. FIG. 6B is a plane diagram in which one of the metal pattern units of FIG. 6A is magnified; and FIG. 6C is a cross-sectional view taken along the line VIc—VIc of FIG. 6B.

As shown therein, nickel and gold are sequentially plated to the surfaces of the metal pattern units 110 on which the solder mask 112 is not applied, or a silver plating is applied thereto. Such a process is an electroplating using the plated electrodes 114. Since the electroplating is to be performed on wire surfaces in a following process, the parts formed by the electroplatings are designated as a metal pattern unit-electroplate 111 and a wire-electroplate 119, respectively, the metal pattern unit-electroplate 111 facilitating a following wire bonding process.

Figure 7A:
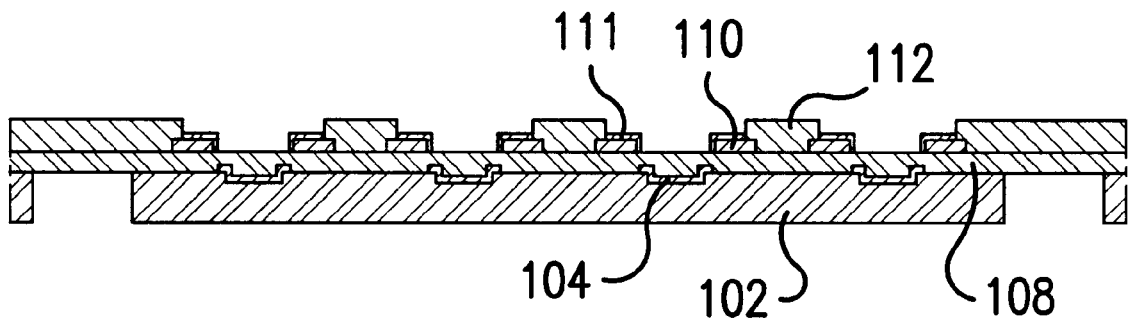
FIG. 7A is a cross-sectional view taken along the line VIIa—VIIa of FIG. 6A illustrating a process of attaching a semiconductor chip to a bottom of an insulating film tape.
Figure 7B:
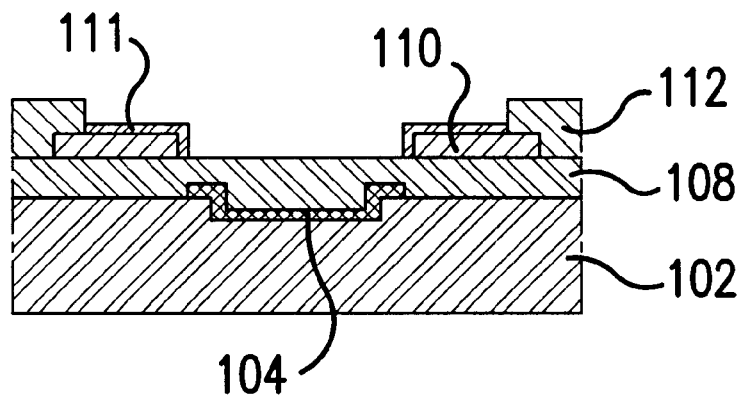
FIG. 7B is a cross-sectional view magnifying one of metal pattern units in FIG. 7A.

Next, FIG. 7A is a cross-sectional view taken along the line VIIa—VIIa of FIG. 6A, which illustrates a process of attaching the semiconductor chip 102 to a bottom of the insulating film tape 108 and FIG. 7B is a cross-sectional view in which one of the metal pattern units in FIG. 7A is magnified.

As shown therein, the semiconductor chip 102 is attached to the bottom surface of the insulating film tape 108, so that the chip pads 104 arranged in the matrix respectively have a one-to-one correspondence to the holes of the insulating film tape 108.

Figure 8:
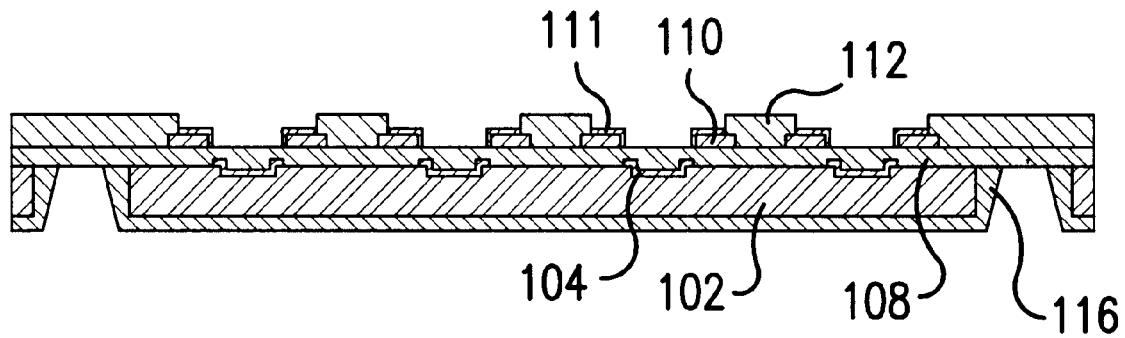

Next, as shown in FIG. 8, an external portion of the semiconductor chip 102, that is side surfaces and a bottom surface of the semiconductor chip 102 are molded with an epoxy mold compound (EMC) 116.

Figure 9:
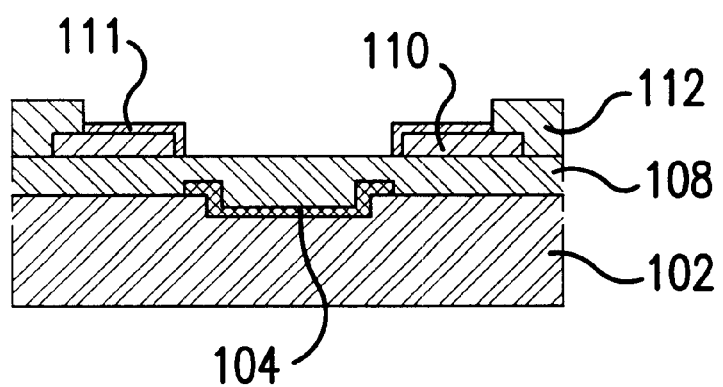

FIG. 9 is a cross-sectional diagram in which one of the chip pads 104 is magnified. As shown therein, by a photolithography process using the metal pattern unit-electroplate 111 and the solder mask 112 as a mask, the insulating film tape 108 formed on the chip pad 104 is etched for thereby forming a hole, the chip pad 104 being exposed through the hole. For the photolithography process, as mentioned above, the insulating film tape 108 is formed of a material which can be etched in the photolithography.

Figure 10A:
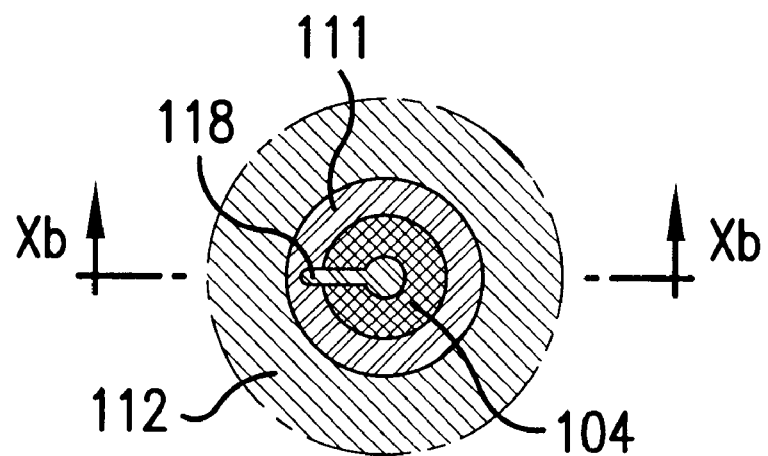
FIG. 10A is a plane diagram magnifying one of chip pads onto which a first wire is bonded.
Figure 10B:
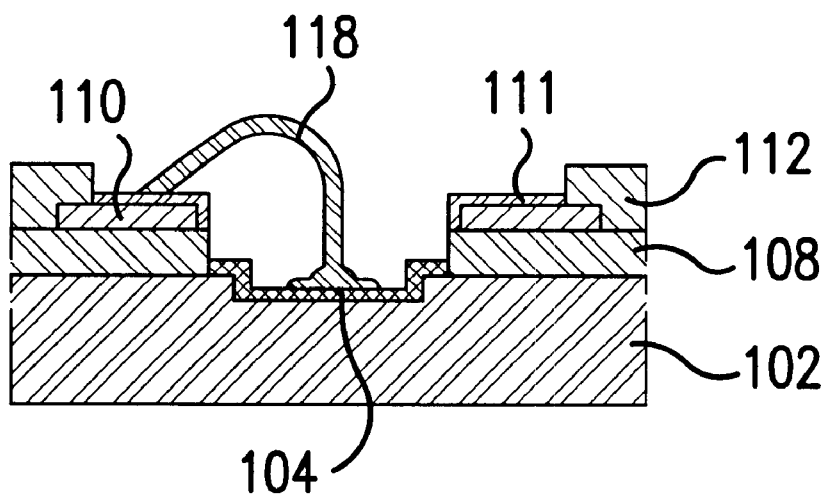
FIG. 10B is a cross-sectional view taken along the line Xb—Xb in FIG. 10A.

FIG. 10A is a plane diagram wherein one of the chip pads 104 is magnified and FIG. 10B is a cross-sectional view taken along the line Xb—Xb in FIG. 10A. As shown therein, the chip pad 104 is bonded to the metal pattern unit-electroplate 111 by a first wire 118.

Figure 11A:
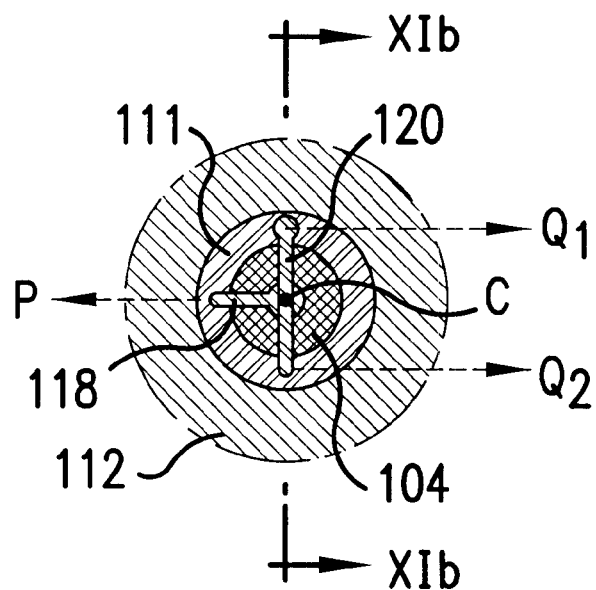
FIG. 11A is a plane diagram magnifying one of chip pads onto which a second wire is bonded.
Figure 11B:
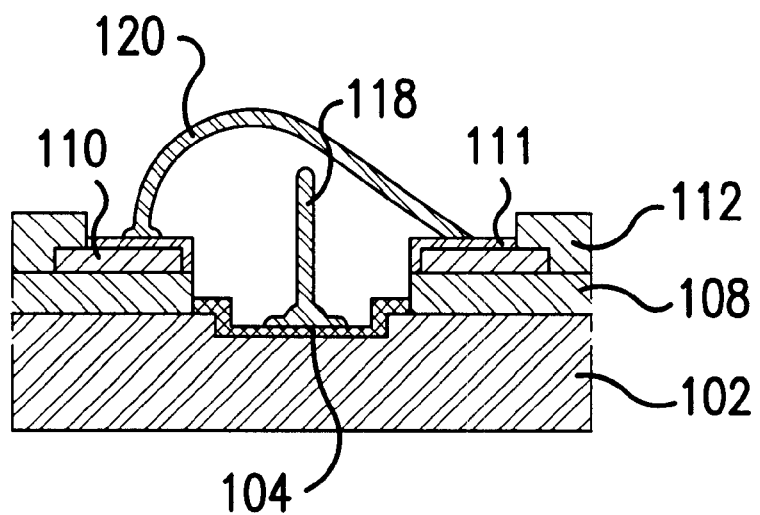
FIG. 11B is a cross-sectional view taken along the line XIb—XIb in FIG. 11A.

Next, FIG. 11A is a plane diagram wherein one of chip pads 104 is magnified and FIG. 11B is a cross-sectional view taken along the line XIb—XIb in FIG. 11A. As shown therein, two points $Q_1$, $Q_2$ of the metal pattern unit-electroplate 111 are bonded by a second wire 120, each of the two points $Q_1$, $Q_2$ being disposed on a line at 90° with a point P of the metal pattern unit-electroplate 111 centering around a center point C of the chip pad 104. Here, it is noted that the second wire 120 and the first wire 118 cross each other, and since the two wires 118, 120 are electrically connected through the round-shape metal pattern unit 110, it is not necessary to consider whether or not the wires 118, 120 come directly in contact with each other.

Figure 12:
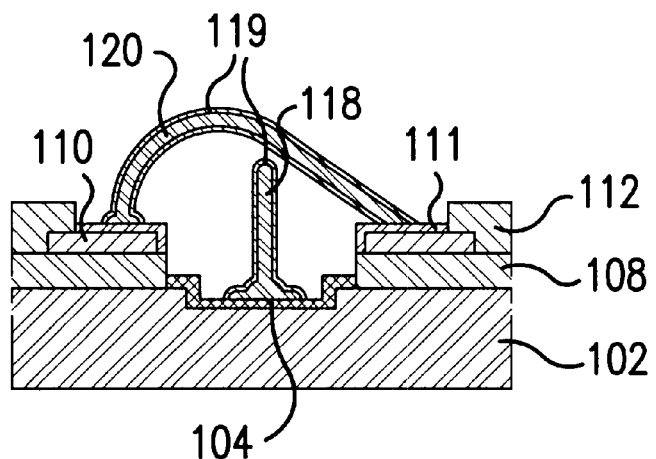

As shown in FIG. 12, the sequential nickel and gold plating processes or the silver plating process is applied to surfaces of the first wire 118 and the second wire 120. This plating process is accomplished using the plating electrode 114. The part formed by the above electroplating will be referred as the wire-electroplate 119. The wire-electroplate 119 strengthens the wires 118, 120 so as not to be bent when mounting the package onto a mother board, and also improves combining efficiency by solder in the process of mounting the package onto the mother board.

Figure 13:
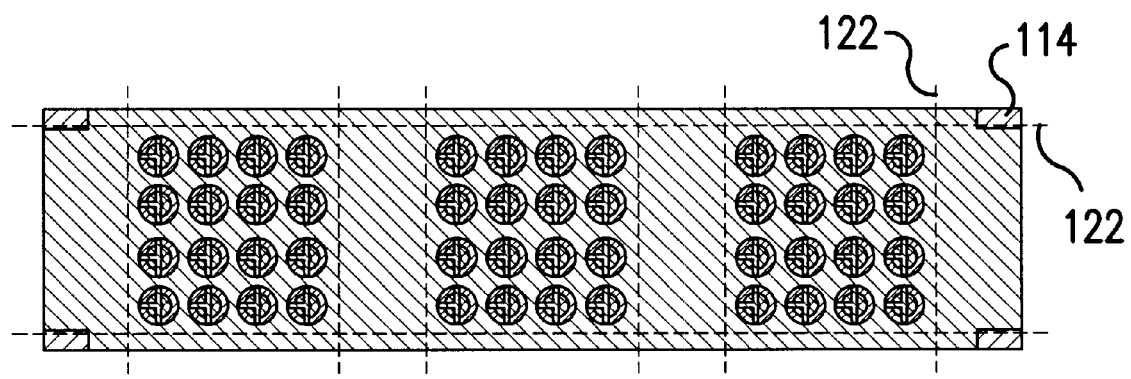
Figure 14A:
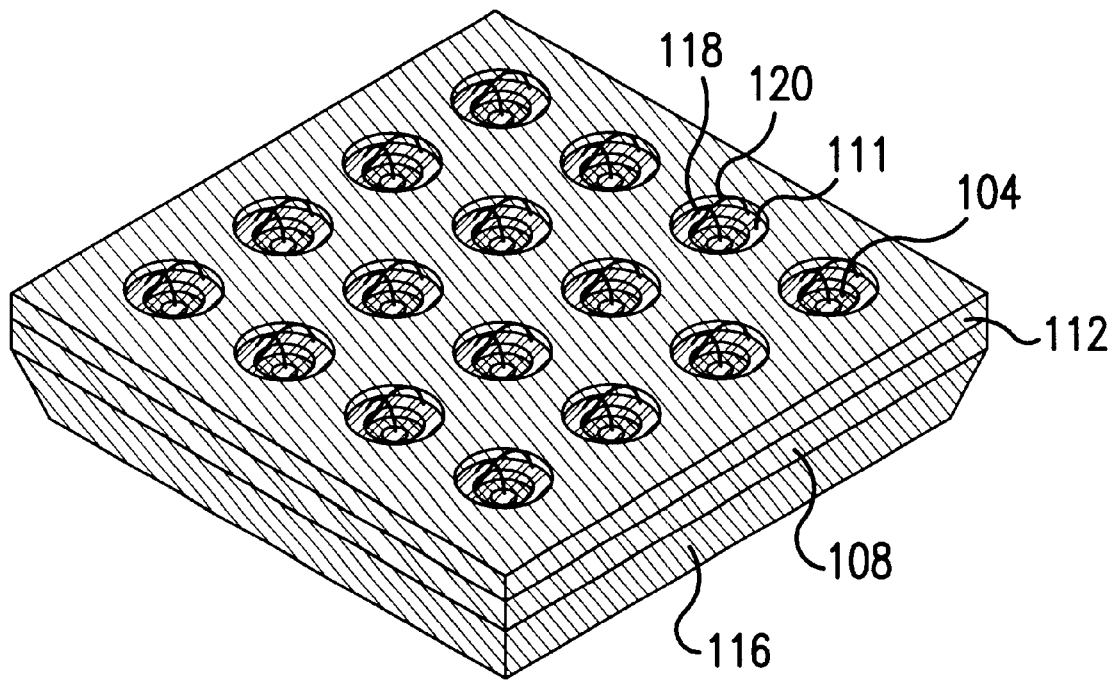
FIG. 14A is a perspective view of a completely fabricated chip size package.
Figure 14B:
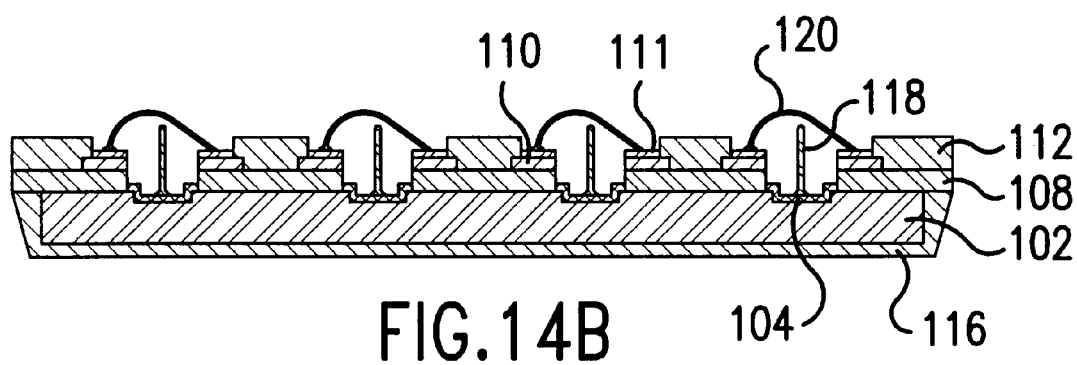

FIG. 13 is a plane diagram of the insulating film tape of the present invention, wherein the insulating film tape 108 is cut along cutting lines 122 in order to separate the resultant insulating tape into individual units and to eliminate the plated electrodes 114, thereby completing the fabrication method of the package according to the first embodiment of the present invention. FIG. 14A is a perspective view of the fabricated chip size package and FIG. 14B is a cross-sectional view of FIG. 14A.

Figure 15A:
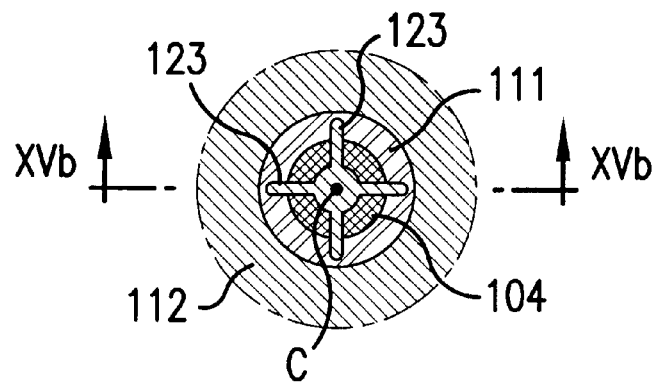
Figure 15B:
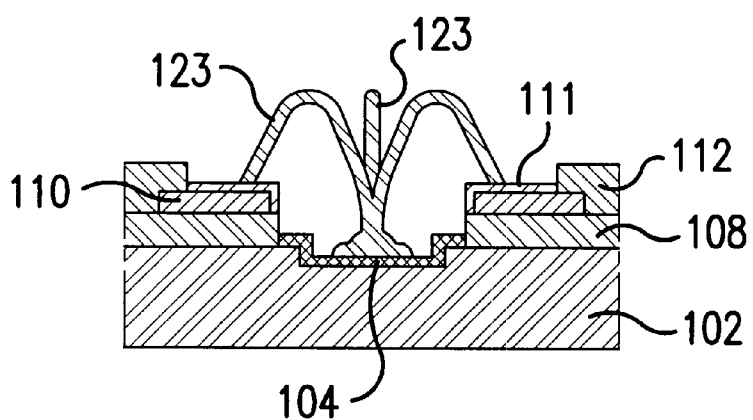

In a fabrication method of a chip size package according to a second embodiment of the present invention, first and second wire bonding structures are implemented differently from the first and second wire bonding structures in the first embodiment thereof. More particularly, after performing the processes from FIGS. 2A through 9 of the first embodiment according to the present invention, at least two wires are bonded between the chip pad 104 and the metal pattern unit-electroplate 111. FIG. 15A shows that four wires 123 bonded between the chip pad 104 and the metal pattern unit-electroplate 111, the four wires 123 being disposed along lines at 90° with respect to each other centering around a center point C of the chip pad 104. FIG. 15B is a cross-sectional view taken along the line XVb—XVb in FIG. 15A.

Figure 16:
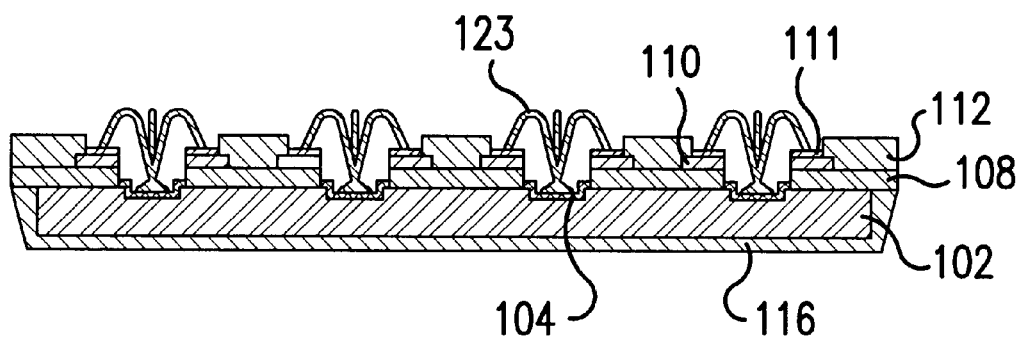
FIG. 16 is a cross-sectional view illustrating a wire arrayed chip size package which is fabricated in accordance with the second embodiment of the present invention.

Similarly, the electroplating is applied to the wires in the fabrication method of the chip size package according to the second embodiment of the present invention and then the insulating film tape is individually separated, thus completing the fabrication of the single package. FIG. 16 illustrates the wire arrayed chip size package which is completely fabricated.

As described above, the wire arrayed chip size package and the fabrication method thereof according to the present invention has several advantages.

The electroplating is applied to the wires in the fabrication method of the chip size package according to the second embodiment of the present invention and then the insulating film tape is individually separated, thus completing the fabrication of the single package. FIG. 16 illustrates the wire arrayed chip size package which is completely fabricated.

Second, because the direct wire bonding is performed between the chip pad and the metal pattern unit, the fabrication method for the wire arrayed chip size package according to the present invention has an effect of fabricating a package of which size is similar to a semiconductor chip and also achieving a package which has the high integration of pins in the same chip size, compared with the conventional art in which the separate area is required for the ribbon bonding.

Third, in the package using the conventional solder balls, when mounting the package on a mother board by soldering and then operating a device, cracks are formed at a boundary surface between the mother board and the solder balls due to the heat generated from the operation of the device. While, the wire arrayed chip size package of the present invention has an effect of preventing the formation of cracks by absorbing the stress of the boundary surface therebetween by the flexibility of the wires.

Fourth, since only the bonding wires are used as the medium which transmits the electric signal between the semiconductor chip and the package, the wire arrayed chip size package and the fabrication method thereof according to the present invention improve the electric characteristic compared with the conventional art wherein the electric signal transmission is achieved from the chip pad through the various mediums such as the ribbon bonding part, the metal pattern units and the solder balls.

Fifth, according to the present invention, an electric test can be applied to the package using the plating electrodes which are formed at the edge portions of the longitudinal portions of the copper film, and thus the electric test can be more easily achieved compared with the conventional art wherein a socket for the electric test should be separately provided.

Lastly, in the wire arrayed chip size package according to the present invention, the EMC is extendedly molded to the back side of the semiconductor chip, which results in the protecting of the chip from the external surroundings.

It will be apparent to those skilled in the art that various modifications and variations can be made in the wire arrayed chip package and the fabrication method thereof of the present invention without departing from the spirit or scope of the invention. Thus, it is intended that the present invention cover the modifications and variations of this invention provided they come within the scope of the appended claims and their equivalents.

What is claimed is:

1. A method for fabricating a chip size package, comprising the steps of:
   etching a copper film applied on an insulating film tape, except for longitudinal marginal copper film portions at edges of the copper film, the etching also forming metal pattern units of the copper film which are peripheral to portions of the insulating film tape corresponding to chip pads of a semiconductor chip, and portions of the copper film connect the longitudinal marginal portions and the metal pattern units;
   forming a solder mask on the insulating film tape excluding inner holes of the metal pattern units, the solder mask not covering the copper film at four edge portions of the longitudinal marginal portions, and the solder mask not covering exterior circular marginal portions of the metal pattern units;
   electroplating portions of surfaces of the metal pattern units on which the solder mask is not formed, for thereby forming metal pattern unit-electroplates;
   attaching the semiconductor chip to a bottom surface of the insulating film tape;
   sealing side surfaces and a bottom surface of the semiconductor chip with an epoxy mold compound;
   etching portions of the insulating film tape formed on the chip pads for thereby exposing the chip pads;
   electrically connecting by wires the metal pattern unit-electrodes and the corresponding chip pads; and
   eliminating portions of the copper film remaining at the four edge portions of the longitudinal marginal portions thereof and cutting the resultant insulating film tape to be separated into individual units.

2. The method for fabricating the chip size package according to claim 1, wherein the chip pads are arranged in a matrix.

3. The method for fabricating the chip size package according to claim 1, wherein the semiconductor chip is attached to the bottom surface of the insulating film tape so that the chip pads respectively have an one-to-one correspondence to the holes of the insulating film tape.

4. The method for fabricating the chip size package according to claim 1, wherein surfaces of the wires are electroplated for thereby forming wire-electroplates.

5. The method for fabricating the chip size package according to claim 1, wherein when electroplating the portions of the surfaces of the metal pattern units, the portions of the copper film remaining at the four edge portions of the longitudinal marginal portions thereof are used as plated electrodes.

6. The method for fabricating the chip size package according to claim 1, wherein when electroplating the surfaces of the wires, the portions of the copper film remaining at the four edge portions of the longitudinal marginal portions thereof are used as plating electrodes.

7. The method for fabricating the chip size package according to claim 1, wherein in the step of etching the portions of the insulating film tape formed on the chip pads for thereby exposing the chip pads, the insulating film tape is etched by photolithography process using the metal pattern unit-electroplates and the solder mask as a mask.

8. The method for fabricating the chip size package according to claim 1, wherein in the step of electrically connecting by wires the metal pattern unit-electrodes and the corresponding chip pads, at least two wires are bonded with respect to each metal pattern unit.

9. The method for fabricating the chip size package according to claim 8, wherein when bonding at least two wires, a first wire is bonded between the chip pad and the metal pattern unit-electroplate and a second wire is bonded between two points of the metal pattern unit-electroplate, each of the two points thereof having 90° with a first wire attached point of the metal pattern unit-electroplate centering around a center point of the chip pad.

10. The method for fabricating the chip size package according to claim 8, wherein when bonding at least two wires, four wires are bonded between the chip pad and the corresponding metal pattern unit-electroplate, the four wires having 90° with each other centering around a center point of the chip pad.

* * * * *